United States Patent [19]
Colon et al.

[11] Patent Number: 5,290,986
[45] Date of Patent: Mar. 1, 1994

[54] THERMALLY ASSISTED SHORTS REMOVAL PROCESS FOR GLASS CERAMIC PRODUCT USING AN RF FIELD

[75] Inventors: Jose L. Colon, Mayaguez, P.R.; Leonard A. Horchos, deceased, late of Clinton Corners, N.Y., by Colombe L. Horchos, executrix; Gary P. Suback, Wappingers Falls, N.Y.

[73] Assignee: International Business Machines Corporation, Armonk, N.Y.

[21] Appl. No.: 781,705

[22] Filed: Oct. 22, 1991

[51] Int. Cl.$^5$ .............................................. H05B 6/10
[52] U.S. Cl. .................................. 219/770; 219/779; 437/170; 29/593
[58] Field of Search ............... 219/10.57, 10.41, 10.81, 219/9.5; 437/4, 7, 8, 61, 170; 29/593

[56] References Cited

U.S. PATENT DOCUMENTS

| | | | |
|---|---|---|---|
| 3,930,304 | 1/1976 | Keller et al. | 29/574 |
| 4,166,918 | 9/1979 | Nostrand et al. | 136/89 R |
| 4,267,633 | 5/1981 | Seller | 29/578 |
| 4,543,171 | 9/1985 | Firester et al. | 204/129.3 |
| 4,573,255 | 3/1986 | Gordon et al. | 29/574 |
| 4,749,454 | 6/1988 | Arya et al. | 204/129.3 |
| 4,806,496 | 2/1989 | Suzuki et al. | 437/4 |
| 5,022,955 | 6/1991 | Chen | 156/627 |
| 5,055,416 | 10/1991 | Weber | 437/4 |

Primary Examiner—Philip H. Leung
Attorney, Agent, or Firm—Ira David Blecker

[57] ABSTRACT

Thermally assisted processes for removing internal defects in glass ceramic products, specifically electrical shorts formed in a substrate during product fabrication, are set forth. According to one aspect of the invention, a method for repairing shorts between metallic conductors located within in a glass ceramic product, such as an electronic substrate, comprises the steps of (a) preconditioning the glass to resist cracking from the generation of heat by any shorts melt down current subsequently applied to said conductors; and (b) subsequently applying a melt down current to said conductors to repair any short located therebetween. The aforestated method minimizes the potential for glass damage resulting from defect repair activity and optimizes defect repair yield. Further aspects of the invention relate to processes that involve preconditioning conductors located within glass ceramic products to assure that molten metal from a short melt down juncture draws back toward parent conductor lines, and processes that are used to effectively control the thermal gradient in the areas within glass ceramic products where shorts repair activity is to take place.

11 Claims, 2 Drawing Sheets

THERMALLY ASSISTED SHORTS REMOVAL PROCESS FOR GLASS CERAMIC PRODUCT USING AN RF FIELD

BACKGROUND OF THE INVENTION

1. Field of the Invention

The invention relates generally to methods for improving the performance of glass ceramic products. Such products include multi-layer ceramic (MLC) electronic substrates upon which semiconductor components, such as integrated circuits, may be fabricated as part of a device package. More particularly, the invention relates to thermally assisted processes for removing internal defects in glass ceramic products, specifically electrical shorts formed in a substrate during the glass ceramic product fabrication process, wherein the novel methods minimize the potential for glass damage resulting from defect repair activity and optimize defect repair yield.

A further aspect of the invention relates to glass ceramic products fabricated as a result of utilizing the aforementioned processes.

2. Description of the Related Art

Many recent advances in the field of electronic device fabrication and packaging utilize improved materials and processes to achieve more durable products, achieve greater device densities, improve overall product performance, etc. For example, it is presently well known to utilize durable glass ceramic products, such as MLC electronic substrates upon which semiconductor components (e.g., integrated circuits) may be fabricated, as part of a device package.

Processes commonly used to fabricate glass ceramic products may yield, for example, substrates having internal defects, such as electrical shorts between metallic conductors located within the substrate, where such conductors are utilized to interconnect components eventually mounted on the substrate surface. Procedures for correcting such defects, in particular the aforementioned type of short, typically involve identification of defect locations followed by the application of an electrical current to "melt" the shorts.

The aforementioned procedures, also used in repairing shorts and shunts in surface (versus internal) substrate electrical conductors, and in repairing defective thin film semiconductor components per se, are problematic in that the heat generated at the location of the short by a melt down process may cause the glass to crack. Such an occurrence would require that the entire substrate be scrapped.

Accordingly, it would be desirable to provide novel processes which minimize the potential for glass damage resulting from defect repair activity, and optimize defect repair yield for glass ceramic products generally. More particularly, it would be desirable if such processes could be applied to removing shorts located within a glass ceramic substrate in such a way as to prevent the substrate from being damaged while a short is being repaired.

As indicated hereinabove, the use of electrical energy to melt shorts is generally well known. In the course of utilizing such processes, various solutions to problems such as preventing a glass substrate and/or component packaging from cracking, for preventing further short conditions from occurring as a result of metals spattering during the short melt down process, etc., have been developed; however such solutions have been directed only to the problems that occur in performing short (and shunt) repair activity on the surface of a substrate, for thin film repair, and/or purposes other than the repair of defects occurring internally in glass ceramic products.

Several of these solutions will be indicated and discussed hereinafter for the purpose of illustrating the state of the "short repair" art.

For the purposes of the discussion of the known art, in particular with reference to short repairs performed in semiconductor devices, an electrical "short" is said to occur when two electrodes come in electrical contact through a conductive metal path extending through a semiconductor body. This path can be caused by a local point defect, which either prevents the formation of semiconductor layers during manufacturing of the device, or causes the semiconductor layers to be peeled off. An electrical "shunt" is the loss of charge in the semiconductor body due either to an imperfect rectifying barrier or to the formation of an ohmic contact via high work-function metal.

Keller, et al in U.S. Pat. No. 3,930,304, Nostrand, et al in U.S. Pat. No. 4,166,918, Firester, et al in U.S. Pat. No. 4,543,171, Arya, et al in U.S. Pat. No. 4,749,454 and Seiler in U.S. Pat. No. 4,267,633, generally teach the use of electrical energy to repair electrical shorts and shunts when fabricating integrated circuits, photoconductors, solar cells, etc.

In particular, Keller, et al in U.S. Pat. No. 3,930,304, teaches methods and apparatus for performing selective burnout trimming of integrated circuit units. According to Keller, et al the selected burnout is carried out by applying a sequence of pulses to the segments to be burned out under monitoring by a measuring circuit which blocks the delivery of further pulses either immediately or after a short time interval once the measuring circuit detects the opening of the connection.

Keller, et al indicates that in many cases the burning out of metallic paths in an integrated circuit produces difficulties because of the ejection of partly liquified particles of connection metallization when electrical energy is applied to the cross section to be burned out. It is noted that these prior art burn out techniques have a potential for impairing product yield and product reliability, for example, by short circuit risks from spattered metal.

Keller, et al goes on to indicate that covering the circuit with a glassy coating does not provide a sufficient remedy for the aforementioned problem since the covering is often torn away or cracked at the place of burnout; this is precisely the type of phenomenon that it would be desirable to prevent, utilizing the invention taught herein, where a glass substrate is in effect the "glass coating" for circuit conductor components located within the substrate.

It was with the aforestated problems in mind that the Keller, et al invention was directed to the application of electrical energy to supplementary conductive pads in the form of a sequence of separate pulses to limit energy expenditure and avoid the spattering problems, glass cracking problems, etc. referred to hereinbefore. Keller's solution did not however involve the preconditioning of a glass substrate which, as will be seen hereinafter, is proposed as an integral step in a shorts repair process contemplated by one aspect of the invention.

Nostrand, et al in U.S. Pat. No. 4,166,918, describes a method for removing the effects of electrical shorts and shunts created during the fabrication process of a solar cell (not a glass ceramic substrate). In particular, Nostrand, et al teaches the application of a reverse bias voltage which is sufficient to burnout electrical shorts and shunts but less than the breakdown voltage of the solar cell. Again the use of electrical energy to repair a short is demonstrated; however no teaching of how to prevent a glass ceramic product from cracking when using such a process is taught.

Firester, et al in U.S. Pat. No. 4,543,171, teaches a method for improving the performance of a photodetector by removing defects such as a shorts and shunts, by preferentially removing a portion of an exposed surface of a detector electrode at the defect site.

The preferential etching at the exposed surface is obtained by immersing the photodetector in a chemical etching ambient which has an etching rate for the exposed surface of the electrode which increases with increasing temperature while applying a reverse bias voltage to the electrodes. The reverse bias voltage has sufficient magnitude to cause a local increase in temperature of the exposed surface at the defect site.

Although useful in repairing shorts utilizing electrical energy, the aforementioned process as taught by Firester, et al, requires product immersion in a chemical ambient and once again fails to teach, claim or even suggest how to prevent a glass ceramic product per se from cracking upon application of electrical energy to melt a short.

Arya, et al in U.S. Pat. No. 4,749,454, describes a method for removing electrical shorts and shunts from a thin film semiconductor device. The method is similar to the one described in Firester, et al in that it involves the step of coating the exposed contact surfaces of the device with a solution (in particular an ionic solution) and successively applying a reverse bias voltage between exposed contact surfaces of electrode pairs.

Once again, the solution is such that it has an etching rate that increases with temperature. The applied reverse bias voltage creates a local temperature increase at the site of shorts and shunts causing them to be selectively etched or oxidized, rendering them substantially nonconductive. Like the other art referred to hereinbefore, the pre-conditioning of a glass ceramic substrate to prevent its cracking upon the application of electrical energy to melt a short, and other aspects of the invention to be described hereinafter, were not the subject of the Arya, et al patent which, once again, is presented herein simply to illustrate the state of the shorts repair art.

Seiler in U.S. Pat. No. 4,267,633 teaches a method for making an integrated circuit with a severable conductive strip. In order to render severing of electrical conductors on integrated circuit chips more reliable, (i.e., reduce the danger of metal spattering, cause only a desired portion of a conductor to be severed, etc.), Seiler proposes increasing the region of insulating material, typically silicon oxide, beneath the zone to be severed. This affects heat dissipation when a burn off current is applied to the strip causing only the metal at the thickened portion of the silicon oxide layer to be severed.

Seiler does not address burning out or otherwise severing electrical shorts occurring within a glass ceramic package, i.e., a defect that is not on the surface of a device.

Other patents and publications teach (1) elevating temperature during a manufacturing process and (2) the application of a voltage for stress testing; but not short repair. For example, Gordon et al in U.S. Pat. No. 4,573,255 teaches that prior to packaging, semiconductor lasers be purged by subjecting them first to high temperatures and high current simultaneously so as to suppress stimulated emission and stress the shunt paths which allow leakage current to flow around the active region of the semiconductor laser.

Suzuki et al, in U.S. Pat. No. 4,806,496, teaches a method for manufacturing photoelectric conversion devices in which short current paths resulting from the formation process of semiconductor lasers can be eliminated by the application of a reverse bias voltage to the layers that are thus heated and made insulating. Once again, no teachings in this reference are directed to pre-conditioning of glass ceramic products, in particular products serving as substrates, so that follow on shorts repair activity can be performed without damaging the glass product itself.

As indicated hereinabove, the processes typically used for removing shorts in glass ceramic products involve the application of an electric current to invoke a short melt down process. Often, pulsed current techniques are used in which a voltage is applied across a defective area to cause the fuse like melt down and effect short removal. The cracking of the glass product, also mentioned hereinabove, is caused by the thermal shock associated with heat required to perform the short melt down. The thermal shock phenomenon occurs because the thermal gradient in the area surrounding the shorts repair activity has a steep slope.

Another problem with the known shorts repair processes used on glass ceramic products is that upon cooling, the metal that was "burned out" may fail to be drawn back to the parent conductor lines and flow back toward the melt down juncture recreating a short condition.

Accordingly, it would be desirable to provide processes which can be used to repair shorts in glass ceramic products which not only preserve the integrity of the glass, but also help assure that molten metal from a short melt down juncture draws back toward parent conductor lines.

SUMMARY OF THE INVENTION

It is an object of this invention to provide simplified and safe processes for opening shorts in glass ceramic products.

It is a further object of the invention to provide thermally assisted shorts removal processes for glass ceramic products which minimize the potential for glass damage due to shorts repair activity.

Another object of the invention is to provide thermally assisted shorts removal processes for glass ceramic products which optimize shorts repair process yield.

Further yet, it is an object of the invention to provide glass ceramic products fabricated as a result of utilizing the aforementioned processes.

Yet another object of the invention is to provide a method for repairing shorts in glass ceramic products which is designed to effectively control the thermal gradient in the areas within the products where shorts repair activity is taking place.

Still another object of the invention is to provide processes which can be used to repair shorts in glass ceramic products which not only preserve the integrity of the glass, but also help assure that molten metal from a short melt down juncture draws back toward parent conductor lines.

According to one aspect of the invention, a method for repairing shorts between metallic conductors located within in a glass ceramic product, such as an electronic substrate, comprises the steps of (a) pre-conditioning the glass to resist cracking from the generation of heat by any shorts melt down current subsequently applied to said conductors; and (b) subsequently applying a melt down current to said conductors to repair any short located therebetween.

According to a further aspect of the invention, the step of pre-conditioning may be performed by applying energy to the metallic conductors located within the glass ceramic product to raise the temperature of the conductors to approximately the melt point of their metallic constituents, so long as the conductors do not actually melt. By applying the energy to the metal and not the glass itself, the amount of time and energy required to precondition the glass to follow on shorts repair activity is minimized.

According to yet another aspect and a preferred embodiment of the invention, the step of applying energy to the glass ceramic product may be advantageously performed by thermally pre-conditioning the product in a radio frequency (RF) field.

Still another aspect of the invention contemplates a method for repairing shorts between metallic conductors located within in a glass ceramic product, such as an electronic substrate, comprising the steps of (a) pre-conditioning the conductors to assure that molten metal from a short melt down juncture draws back toward parent conductor lines; and (b) pre-conditioning the glass to resist cracking from the generation of heat by any shorts melt down current subsequently applied to said conductors.

Yet another aspect of the invention contemplates the provision of methods for effectively controlling the thermal gradient in the areas within glass ceramic products where shorts repair activity is to take place, comprising the steps of: (a) applying energy to the metallic conductors located within a glass ceramic product to raise the temperature of the conductors to approximately the melt point of their metallic constituents, so long as the conductors do not actually melt; and (b) maintaining the application of a sufficient amount of energy to said conductors to effectively keep the slope of the thermal gradient below a preselected level, in a predetermined region in proximity to where shorts repair activity is to take place, before commencing the short repair activity.

A further aspect of the invention are the products (the glass ceramic products themselves) that are produced as a result of the aforementioned processes. Such products are more likely to be free of cracks and other forms of heat damage caused by prior art short repair processes.

The invention features a shorts melt down process that may be used in repairing defects in glass ceramic products wherein, as a direct result of product preconditioning, the products resist stress and cracking in areas where shorts repair activity may take place.

Additionally, conductor surface tension and capillary action, at the melt down juncture, is enhanced by the pre-conditioning of the products so that molten short material produced when repairing a short draws back to its parent lines mass structures to avoid the re-occurrence of short conditions after they have been ostensibly repaired.

These and other objects and features of the present invention and the manner of obtaining them will become apparent to those skilled in the art, and the invention itself will be best understood by reference to the following detailed description read in conjunction with the accompanying Drawing.

DETAILED DESCRIPTION

Figure 1:
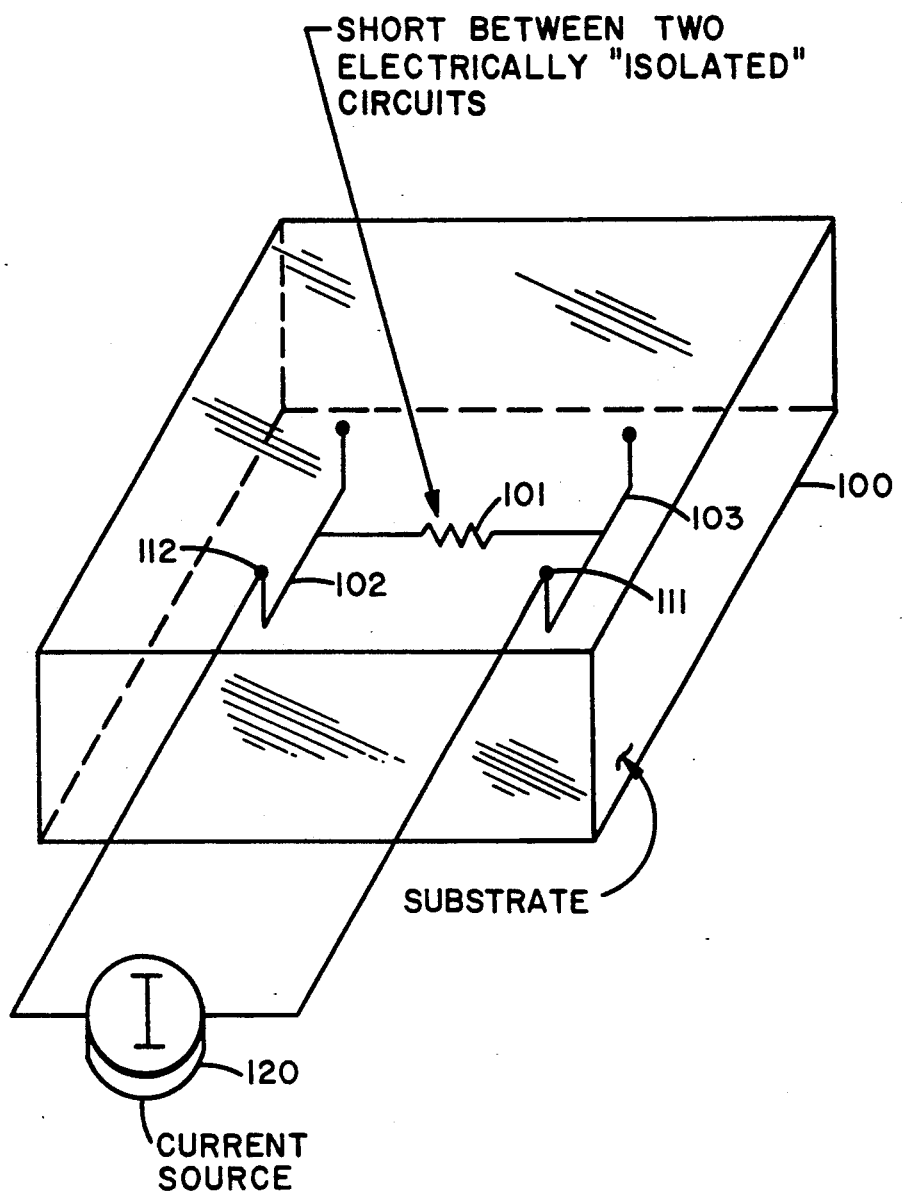
FIG. 1 depicts a glass ceramic product, in particular an electronics substrate, that contains a short between two electrically isolated circuits.

As indicated hereinabove, FIG. 1 depicts a glass ceramic substrate, 100, that contains a short, 101, between two electrically isolated circuits, 102 and 103.

The prior art methods, referred to hereinbefore, for removing a short, such as short 101, call for the application of an electric current to, for example, points 111 and 112 via a current source, such as source 120, to cause short 101, having the highest resistance in the depicted circuit, to heat up and melt. Too often however, as indicated hereinabove, the result is that the glass ceramic substrate, 100, will crack in the vicinity of the shorts repair activity and have to be scrapped.

Instead of first applying the current to melt a short, one aspect of the invention contemplates (1) pre-conditioning the substrate to resist cracking or other damage resulting from short repair activity and at the same time (2) pre-conditioning the conductors themselves so that upon "melting" a short, the molten metal draws back to parent conductor lines 102 and 103; instead of flowing back to the short melt down juncture and re-creating the short condition.

Figure 2:
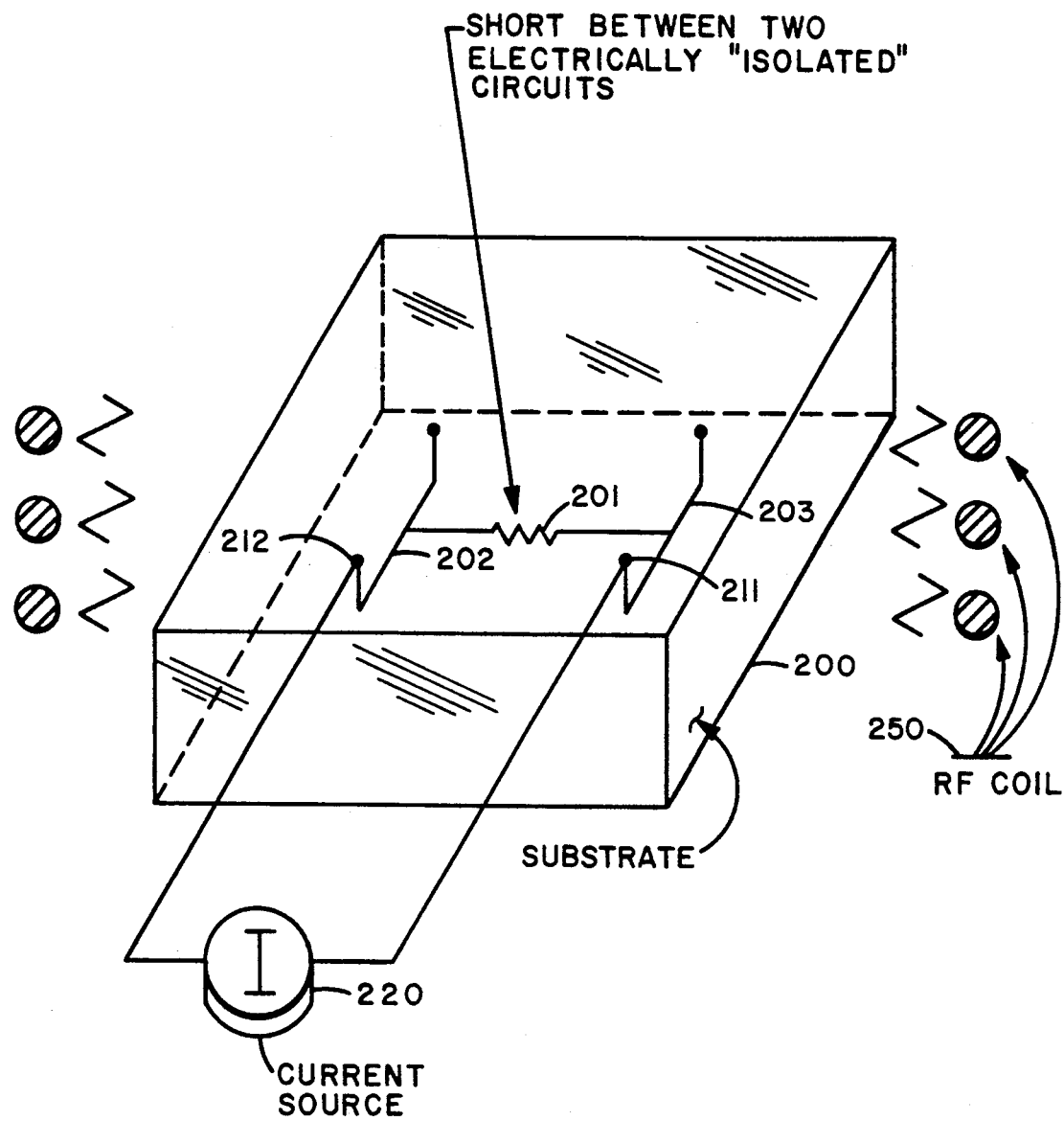
FIG. 2 illustrates a preferred mechanism for removing the short depicted in FIG. 1 by first placing the product (the illustrative substrate) in an RF field to raise the conductor temperature to just below the conductor melt point; followed by the application of a current across the shorted conductors to actually melt the short.

FIG. 2 illustrates a preferred mechanism for removing the short depicted in FIG. 1. The reference numerals used in FIG. 2 track those used in FIG. 1, i.e., substrate 200 in FIG. 2, is meant the same as substrate 100 in FIG. 1; short 201 in FIG. 2 and short 101 in FIG. 1 are meant to illustrate the same short, etc. The only additional component shown in FIG. 2 is RF coil 250.

By first placing illustrative substrate 200 in an RF field (to raise the conductor temperature and condition the surrounding glass from within), before applying the follow on current across the shorted conductors to actually melt the short, the benefits of the invention may be achieved.

According to a preferred embodiment of the invention, thermally pre-conditioning all substrate (brick) conductors (such as conductors 202 and 203 of FIG. 2) in an RF field can bring the conductor metallic constituents up to a temperature that is very near the melt point of the conductor itself; but below the sinter temperature of the glass ceramic (approximately 975 degrees C.). This technique will raise the latent energy in the conductors per se.

Those skilled in the art will readily appreciate that as the temperature of the conductors is increased, resistance increases and ultimately this will help in melting a short, such as illustrative short 201.

The aforementioned activity of heating conductive lines 202 and 203 will, by conductance, also heat the glass ceramic substrate and pre-condition it thermally to receive the follow on shorts removal activity. In effect, the processes contemplated by the invention may be used to effectively control the slope of the thermal gradient in predefined areas within glass ceramic products where shorts repair activity is to take place.

According to the preferred embodiment of the invention, the heating of the glass is done just in the areas surrounding the metallic constituents. However the invention, in addition to the preferred type of process, also contemplates processes that may heat larger areas or indeed the entire brick prior to application of the shorts removal current.

The thermally pre-conditioned conductors, and the "to a lesser extent" preconditioned substrate, are now thermally prepared to receive the pulsed current from, for example, current source 220 attached to points 211 and 212 as shown in FIG. 2 (or heat from another source), to physically bring the short to its complete melt (fuse activity) thus removing or breaking continuity of the short.

As indicated hereinabove, in addition to preventing cracking of the glass ceramic product and effecting the easy removal of shorts, a further benefit derived from conductor preheat as contemplated by the invention is the enhancement of surface tension and capillary action at the melt down juncture. This benefit encourages the molten short material to draw back to its parent lines mass structures which have been thermally preconditioned to more receptively receive the molten short made by the pulsed current.

Yet another significant benefit of the heat up of all substrate material surrounding all conducting lines is the decrease in mechanical stress the substrate experiences during fuse like melt down of the shorts area.

What has been described are thermally assisted shorts removal processes for repairing shorts in glass ceramic products, processes for assuring that a short once repaired (i.e., that the molten metal draws back to the parent conductor lines rather than the melt down juncture), processes for controlling the thermal gradient in the area where shorts repair activity is to take place within glass ceramic products, and products that result from practicing the aforementioned processes.

These processes and products realize all of the objectives set forth hereinbefore.

Those skilled in the art will recognize that the foregoing description has been presented for the sake of illustration and description only. It is not intended to be exhaustive or to limit the invention to the precise form disclosed, and obviously many modifications and variations are possible in light of the above teaching.

The embodiments and examples set forth herein were presented in order to best explain the principles of the instant invention and its practical application to thereby enable others skilled in the art to best utilize the instant invention in various embodiments and various modifications as are suited to the particular use contemplated. Accordingly, it is intended that the invention described herein in the aforementioned illustrative sense be limited only as specified in the claims.

What is claimed is:

1. A method of repairing shorts between metallic conductors located within in a glass ceramic product, comprising the steps of:

(a) pre-conditioning the glass ceramic product to resist cracking from the generation of heat during any follow on shorts removal activity wherein said step of pre-conditioning is performed by applying energy to the metallic conductors located within the glass ceramic product to raise the temperature of the conductors to approximately the melt point of their metallic constituents, so long as the conductors do not actually melt and wherein said step of applying energy is performed by placing the glass ceramic product in a radio frequency (RF) field; and (b) subsequently applying heat to melt a given short between the metallic conductors located within the glass ceramic product.

2. A method as set forth in claim 1 wherein said step of subsequently applying heat is performed by applying a melt down current to said conductors to repair any short located therebetween.

3. A method of repairing shorts between metallic conductors located within in a glass ceramic product, comprising the steps of:

(a) pre-conditioning the conductors to assure that molten metal from a short melt down juncture draws back toward the unmelted conductors and away from the short melt down juncture;

(b) pre-conditioning the glass ceramic product to resist cracking from the generation of heat during any follow on shorts removal activity; and (c) subsequently applying heat to melt a given short between the metallic conductors located within the glass ceramic product.

4. A method as set forth in claim 3 wherein said step of subsequently applying heat to melt a given short is performed by applying a melt down current to said conductors to repair any short located therebetween.

5. A method as set forth in claim 3 wherein at least one of steps (a) and (b) is performed by applying energy to the metallic conductors located within the glass ceramic product to raise the temperature of the conductors to approximately the melt point of their metallic constituents, so long as the conductors do not actually melt.

6. A method as set forth in claim 5 wherein said step of applying energy is performed by placing the glass ceramic product in a radio frequency (RF) field.

7. A method of effective controlling the thermal gradient in a predetermined region within a glass ceramic product while repairing a short between metallic conductors located within said predetermined region, comprising the steps of:

(a) applying energy to the metallic conductors located within a glass ceramic product to raise the temperature of the conductors to approximately the melt point of their metallic constituents, so long as the conductors do not actually melt wherein said step of applying energy to the metallic conductors further comprises the step of placing the glass ceramic product in a radio frequency (RF) field; and (b) maintaining the application of a sufficient amount of energy to said conductors to effectively keep the slope of the thermal gradient in said predetermined region below a preselected level at the time short repair activity is commenced.

8. A method as set forth in claim 7 further comprising the step of commencing short repair activity by subsequently applying heat to melt a given short while said thermal gradient in said predetermined region remains below said preselected level.

9. A method as set forth in claim 8 wherein said step of subsequently applying heat to melt a given short is performed by applying a melt down current to said conductors to repair any short located therebetween.

10. A method of effectively controlling the thermal gradient in a predetermined region within a glass ceramic product while repair a short between metallic conductors located within such region, comprising the steps of:

(a) applying energy to the metallic conductors located within a glass ceramic product to raise the temperature of the conductors to approximately the melt point of their metallic constituents, so long as the conductors do not actually melt, and to raise the temperature of glass surrounding the conductors so that the slope of the thermal gradient in said predetermined region is less than a preselected level wherein said step of applying energy to the metallic conductors further comprises the step of placing the glass ceramic product in a radio frequency (RF) field; and (b) commencing short repair activity by subsequently applying heat to melt a given short between the metallic conductors located within the glass ceramic product while the slope of the thermal gradient in said predetermined region remains below said preselected level.

11. A method as set forth in claim 10 wherein said step of commencing short repair activity by subsequently applying heat to melt a given short is performed by applying a melt down current to said conductors to repair any short located therebetween.

* * * * *